United States Patent [19]

Nishioka et al.

[11] Patent Number: 4,822,713

[45] Date of Patent: Apr. 18, 1989

[54] LIGHT-SENSITIVE COMPOSITION WITH FLUORINE CONTAINING ACRYLATE OR METHACRYLATE COPOLYMER SURFACTANT

[75] Inventors: Akira Nishioka, Shizuoka; Masayuki Kamei, Sakai; Toshihiko Umaba, Takaishi, all of Japan

[73] Assignee: Fuji Photo Film Co., Ltd., Minami-ashigara, Japan

[21] Appl. No.: 5,659

[22] Filed: Jan. 21, 1987

[30] Foreign Application Priority Data

Jan. 23, 1986 [JP] Japan .................................. 61-12804

[51] Int. Cl.$^4$ .......................... G03C 1/60; G03C 1/68; G03C 1/76
[52] U.S. Cl. ..................................... 430/175; 430/155; 430/157; 430/165; 430/191; 430/270; 430/281; 430/302; 430/907; 430/910
[58] Field of Search ............... 430/175, 191, 270, 281, 430/155, 157, 165, 907, 910

[56] References Cited

U.S. PATENT DOCUMENTS

| | | | |
|---|---|---|---|
| 3,787,351 | 1/1974 | Olson .................................. | 523/453 |
| 3,790,382 | 2/1974 | Dahlman ............................ | 430/175 |
| 3,944,527 | 3/1976 | McCown ........................... | 260/79.7 |
| 3,995,085 | 11/1976 | McCown ........................... | 428/262 |
| 4,487,823 | 12/1984 | Lehmann et al. .................... | 430/56 |
| 4,504,567 | 3/1985 | Yamamoto et al. ................ | 430/165 |
| 4,686,168 | 8/1987 | Fujii et al. ........................... | 430/326 |

FOREIGN PATENT DOCUMENTS

| | | |
|---|---|---|
| 60-179742 | 9/1985 | Japan . |
| 2023858 | 1/1980 | United Kingdom . |
| 2134275 | 8/1984 | United Kingdom . |

*Primary Examiner*—Charles L. Bowers, Jr.
*Attorney, Agent, or Firm*—Burns, Doane, Swecker & Mathis

[57] ABSTRACT

A light-sensitive composition for use in making a light-sensitive layer of, for instance, a presensitized plate from which a lithographic printing plate is to be prepared, which comprises a fluorine-containing surfactant and is characterized in that the fluorine-containing surfactant is a copolymer of (i) an acrylate or methacrylate having a fluoroaliphatic group, Rf, which has 3 to 20 carbon atoms and at least 40% by weight of fluorine atoms and at least three terminal carbon atoms of which are fully fluorinated; and (ii) a poly(oxyalkylene) (meth)acrylate and that Rf group-containing (meth)acrylate monomer unit is present in the copolymer in an amount of from 25 to 70% by weight based on the total weight of the copolymer. The composition provides a light-sensitive layer of a uniform thickness and it provides a lithographic printing plate having acceptable and excellent properties.

12 Claims, No Drawings

LIGHT-SENSITIVE COMPOSITION WITH FLUORINE CONTAINING ACRYLATE OR METHACRYLATE COPOLYMER SURFACTANT

BACKGROUND OF THE INVENTION

1. Field of the Invention

The present invention relates to a light-sensitive composition containing a fluorine-containing surfactant, and more specifically, to a light-sensitive composition capable of obtaining a light-sensitive layer of a uniform film thickness on a support.

2. Description of the Prior Art

Light-sensitive compositions have, in general, been used in a manner that they are coated on a support such as surface treated aluminum plates, paper, plastics or $SiO_2/Si$ wafer in the form of solution or dispersion in an organic solvent and then are dried. When the light-sensitive compositions are coated on a support and then are dried, it is very important to form a light-sensitive layer of a uniform thickness on the support in order to sufficiently take advantage of the properties of the light-sensitive composition.

Heretofore, it has been quite difficult to obtain such a uniform light-sensitive layer in the drying process. According to a conventional process, the drying process comprises blowing air, having conditioned moisture and temperature, on a support coated with a light-sensitive composition to evaporate an organic solvent and form a light-sensitive layer. However, this drying process leads to the formation of non-uniform light-sensitive layer which has a non-uniform distribution of thickness due to the flow and turbulent flow of the air blown.

The unevenness of the thickness of the light-sensitive layer not only gives an unfavorable impression to its appearance but also results in inconsistant sensitivity and bad reproduction of the original pattern. Moreover, it leads to the lowering of printing durability and strength of image areas when the light-sensitive composition is used to form a printing plate.

In order to eliminate the unevenness of film thickness in the light-sensitive layer obtained after drying, it is necessary to carry out drying in a quite moderate manner. For this purpose, there have been proposed, for example, a method in which the velocity of air flow for drying is limited to a quite low value and the drying process is effected for an extremely long period of time, a method comprising utilizing air for drying having a temperature gradient, in which low temperature air is used in initial stages while high temperature air is sued in the final stage or a method in which an organic solvent having a relatively high boiling point is used in a larger amount to disperse and dissolve the light-sensitive composition. However, these methods cannot completely eliminate the unevenness of film thickness of the light-sensitive layer because of flowing air for drying and, in particular, in these methods a large and complicated installation for drying is needed since a web support is continuously conveyed to continuously coat it with a light-sensitive composition and continuously dry the coated composition, when manufacturing presensitized plates from which light-sensitive printing plates is to be prepared in an industrial scale. Moreover, if a specific solvent is selected and used, there is a serious drawback in that the selection of light-sensitive composition per se should be restricted within a narrow range.

SUMMARY OF THE INVENTION

Accordingly, the principal object of this invention is to provide a light-sensitive composition which provides a light-sensitive layer having uniform thickness when it is applied to the surface of a support and then dried.

Another object of this invention is to provide a light-sensitive composition which provides a light-sensitive layer having uniform thickness when it is applied to the surface of a support and then dried for a short period of time.

A further object of this invention is to provide a light-sensitive composition capable of providing a light-sensitive layer having uniform thickness by applying it to the surface of a support and drying with a simple installation for drying.

The inventors of this invention have conducted various studies for overcoming the aforementioned disadvantages accompanied by the conventional techniques and found out that these disadvantages can effectively be eliminated by incorporating a specific fluorine-containing surfactant into a light-sensitive composition to be coated on a support i.e., the use of such additive makes it possible to solve the problem of unevenness of film thickness of the resultant light-sensitive layer observed during the drying process and thus completed the present invention. The present invention provides a light-sensitive composition containing a fluorine-containing surfactant characterized in that the fluorine-containing surfactant is a copolymer of (i) an acrylate or a methacrylate, said acrylate and said methacrylate having a fluoroaliphatic group, Rf, which has 3 to 20 carbon atoms and at least 40% by weight of fluorine atoms, and at least three terminal carbon atoms of which are fully fluorinated and (ii) a poly(oxyalkylene)acrylate or a poly(oxyalkylene) methacrylate, and that the Rf group-containing acrylate or Rf group-containing methacrylate monomer unit is included in an amount of 25 to 70% by weight based on the weight of the copolymer.

DETAILED DESCRIPTION OF THE INVENTION

The light-sensitive composition of the present invention is advantageously used for a presensitized plate from which a lithographic printing plate is to be prepared, and therefore it will hereunder be explained more in detail with reference to such presensitized plates.

A support on which the light-sensitive composition is to be coated is a plate material having a high dimensional stability and can be any one of those used as conventional supports for printing plates. Examples of such a support include paper with or without a laminated plastic sheet such as polyethylene, polypropylene, polystyrene; a metal plate such as aluminum (inclusive of aluminum alloys), zinc, iron, copper; a film or sheet of plastic such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal; or paper or a plastic film on which a metal film or sheet such as those mentioned above is laminated or deposited. Particularly preferred example thereof is an aluminum plate. The aluminum plate includes a pure aluminum plate and an aluminum alloy plate. Such aluminum alloys include alloys of aluminum with a metal such as silicon, copper, manganese, magnesium, chromium, zinc, lead, bismuth and nickel. These alloys may also include a trace amount of impurities in addition to iron and titanium.

The support used in this invention may be subjected to surface treatment according to need. For example, the surface of a support is hydrophilized when it is used for making a presensitized plate from which a lithographic printing plate is to be prepared. The hydrophilization of a support may be carried out by a so-called surface treatment, for instance, chemical treatment, exposure to discharge, flame treatment, exposure to UV rays, application of high frequency, glow discharge treatment, active plasma treatment, laser treatment which are disclosed in U.S. Pat. Nos. 2,764,520; 3,497.407; 3,145,242; 3,376,208; 3,072,483; 3,475,193; and 3,360,448 and British Patent No. 788,365, if the support has a plastic surface. Further, the support may be coated with an underlying layer on the plastic surface thereof after such surface treatment.

The hydrophilization of support is also carried out by applying a plastic coating to the plastic surface of a support and a variety of methods therefor have been proposed. One such method double-layer method comprises applying a first hydrophobic resin layer having a good adhesion to the plastic surface and then applying a second hydrophilic resin layer thereon. Another method (single-layer method) comprises applying a resin layer, the polymer molecule constituting the resin including both hydrophobic groups and hydrophilic groups.

When a support used has a surface of a metal such as, in particular, aluminum, the surface is preferably subjected to surface treatment, for instance, graining; dipping treatment in an aqueous solution of sodium silicate, potassium fluorozirconate, phosphates or the like; or anodization. Moreover, there are also effectively used as a support, an aluminum plate which has been subjected to graining followed by dipping it in an aqueous solution of sodium silicate and an aluminum plate which has been anodized and then dipped in an aqueous solution of an alkali metal silicate. (see, U.S. Pat. No. 3,181,461). The aforementioned anodization is effected by utilizing an aluminum plate as anode and supplying electric current therethrough in an electrolyte comprised of a nonaqueous or aqueous solution containing at least one of an inorganic acid such as phosphoric acid, chromic acid or sulfuric acid, boric acid or an organic acid such as oxalic acid or sulfamic acid.

In addition, it is also effective to utilize silicate electrode position for surface treatment (hydrophilization) of a support.

The hydrophilization of the surface of a support is effected not only to make the surface hydrophilic but also to prevent the detrimental reaction with a light-sensitive layer applied thereon from taking place and enhance the adhesion of the surface of the support to the light-sensitive layer.

It is also possible to optionally pretreat the surface of a support for the purposes of removing oils such as calender oil from the surface and exposing a clean aluminum surface, prior to graining. There has been used, for example a solvent such as trichlene, a surfactant or the like for degreasing the surface. On the other hand, an alkali etching agent such as sodium hydroxide or potassium hydroxide is widely used for exposing the clean surface of the support.

The graining is effectively carried out according to mechanical, chemical or electrochemical methods. The mechanical methods include ball graining, blast graining, brush graining which comprises rubbing the surface to be grained with an aqueous slurry of an abrasive material such as pumice powder using a nylon brush. A preferred example of the chemical method comprises immersing the support in a saturated aqueous solution of a mineral acid salt of aluminum disclosed in Japanese Patent Application (opened to public inspection, hereunder referred to as "OPI") No. 54-31187 which corresponds to U.S. Pat. No. 4,201,836. A preferred electrochemical method comprises electrolyzing with alternating electric current in an acidic electrolyte composed of hydrochloric acid, nitric acid or the mixture thereof. Among these surface roughening treatment, the method for surface roughening comprising a combination of a mechanical and an electrochemical roughening treatment is particularly preferred in view of the strong adhesion of resin images to the support (see U.S. Pat. No. 4,476,006).

The graining according to the aforementioned methods is preferably carried out until the center line average surface roughness (Ha) reaches 0.3 to 1.0 $\mu$.

The aluminum plate thus grained is then subjected to water washing and chemical etching treatment according to need.

Such an etching liquid is usually selected from aqueous solutions of a base or an acid which can dissolve aluminum therein. In this respect, it is necessary that the etching liquid does not form a film other than aluminum film, derived from components of the etching liquid, on the etched surface. Examples of the preferred etching agent include basic materials such as sodium hydroxide, potassium hydroxide, trisodium phosphate, disodiumphosphate, tripotassium phosphate, dipotassium phosphate; and acidic materials such as sulfuric acid, persulfuric acid, phosphoric acid, hydrochloric acid and salts thereof. However, salts of a metal such as zinc, chromium, cobalt, nickel, copper having an ionization tendency lower than that of aluminum are not desirable since they have a tendency to form an undesired film on the etched surface.

The concentration and temperature of the etching liquid are not critical, but they are most preferably determined so that the dissolution rate of aluminum or an alloy thereof used is 0.3 to 40 $g/m^2$ per one minute of immersion time.

The etching is preferably effected by, for instance, immersing an aluminum plate in an etching liquid or applying an etching liquid to the surface of an aluminum plate to be treated so that the total amount of aluminum removed by etching falls within the range of from 0.5 to 10 $g/m^2$.

It is preferred to use an aqueous solution of a base as such etching agent because of its high etching rate. In this case, smut is in general formed during the etching procedure and thus the aluminum plate is desmutted with an acid. The acid used in the desmutting treatment includes nitric acid, sulfuric acid, phosphoric acid, chromic acid, hydrofluoric acid, borofluoric acid or the like.

The aluminum plate etched may be washed with water and anodized according to need. The anodization can be carried out in a manner conventionally utilized in the art. The anodization film can be formed on an aluminum plate by supplying alternating current or direct current in a nonaqueous or an aqueous solution containing at least one member selected from the group consisting of sulfuric acid, phosphoric acid, chromic acid, axalic acid, sulfamic acid, benzenesulfonic acid.

The conditions for anodization vary depending on the kind of electrolyte used and, in general, the anodization is desirably carried out under the conditions such that the concentration of the electrolyte is 1 to 80% by weight, the temperature thereof is 5 to 70° C., the current density is 0.5 to 60 $A/dm^2$, the voltage applied is 1 to 100V and the electrolysis time is between 30 seconds to 50 minutes.

Among these anodization processes, preferred are those disclosed in British Pat. No. 1,412,768 in which an aluminum plate is anodized under a high current density in sulfuric acid and disclosed in U.S. Patent No. 3,511,611 in which the anodization is carried out in phosphoric acid as electrolyte.

The aluminum plate thus roughened and anodized may be subjected to hydrophilization treatment according to need. Preferred methods therefor are those disclosed in U.S. Pat. Nos. 2,714,066 and 3,181,461 in which the plate is treated with an aqueous solution of an alkali metal silicate such as sodium silicate, disclosed in Japanese Patent Publn. No. 36-22063 in which the plate is treated with potassium fluorozirconate and disclosed in U.S. Pat. No. 4,153,461 in which polyvinyl phosphonic acid is used to treat the plate.

The organic light-sensitive materials which may be used herein should cause change in their solubility or swelling property in a developer after exposure. Particularly preferred are diazo compounds such as a light-sensitive composition comprising a diazo resin and shellac, see Japanese Patent Application (OPI) No. 47-24404.; poly(hydroxyethyl methacrylate) and a diazo resin; a diazo resin and a soluble polyamide resin (U.S. Pat. No. 3,751,257); an azido photosensitive material and an epoxy resin (U.S. Pat. No. 2,852,379); light-sensitive resins having unsaturated double bonds in the molecule and capable of causing dimerization reaction to make the resin insoluble upon exposure to an actinic light, representatives thereof being axido photosensitive materials, diazo resins, polyvinyl cinnamates, such as a derivative of polyvinyl cinnamate disclosed in British Patent Nos. 843,545 and 966,297 and U.S. Pat. No. 2,725,372, a photosensitive polyester obtained by condensing bisphenol A and divanillal cyclohexanone or p-phenylemediethoxy acrylate and 1,4-di-$\beta$-hydroxyethoxy cyclohexanone and disclosed in Canadian Patent No. 696,997 and a prepolymer of diallylphthalate described in U.S. Pat. No. 3,462,267; and ethylenic unsaturated compounds having at least two unsaturated double bonds in the molecule and, upon exposure to an actinic light, capable of causing polymerization reaction such as unsaturated esters of polyols, for instance, ethylenedi(meth)acrylate, diethyleneglycol di(meth)acrylate, glycerol di(meth)acrylate, glycerol tri(meth)acrylate, ethylene di(meth)acrylate, 1,3-propylene di(meth)acrylate, 1,4-cyclohexanediol di(meth)acrylate, 1,4-benezenediol di(meth)acrylate, pentaerythritol tetra(meth)acrylate, 1,3-propyleneglycol di(meth)acrylate, 1,5-pentanediol di(meth)acrylate, pentaerythritol tri(meth)acrylate, bis(meth)acrylate of polyethylene glycol having a molecular weight of 50 to 500, unsaturated amides, particularly, amides of $\alpha$-methylene carboxylic acid and in particular those of $\alpha$,w-diamine and w-diamine having an intermediate oxygen atom such as methylene bis(meth)acrylamide, and diethylene triamine tris(meth)acrylamide, divinyl succinate, divinyl adipate, divinyl phthalate, divinyl terephthalate, divinyl benzene-1,3-disulfonate and a suitable binder such as compounds which are a derivative of polyvinyl alcohol or cellulose and have carboxyl groups at side chains, for instance, polyvinyl hydrogen phthalate, carboxymethyl cellulose; or light-sensitive compositions comprising a copolymer of methyl methacrylate and methacrylic acid. These examples are effective as negative working type light-sensitive compositions which become insoluble by the action of actinic light.

Examples of positive working type light-sensitive materials include o-diazo oxide type photosensitive material disclosed in U.S. Pat. Nos. 3,635,709, 3,061,430 and 3,061,120; phosphorous wolframates of diazo resin disclosed in Japanese Patent Publn. No. 38-7663; yellow prussiate of diazo resin disclosed in U.S. Pat. No. 3,113,023 and a diazo resin and polyvinyl hydrogen phthalate disclosed in Japanese Patent Publication No. 43-23684. Moreover, light-sensitive compositions comprising linear polyamide and a monomer having unsaturated double bonds capable of causing addition polymerization are also useful and they are, for instance, disclosed in U.S. Pat. Nos. 3,081,168; 3,486,903; 3,512,971 and 3,615,629.

Particularly useful light-sensitive compositions include light-sensitive composition comprising a diazo resin and shellac disclosed in Japanese Patent Appln. (OPI) No. 47-24404; a composition comprising a copolymer of a diazo resin and hydroxyethyl methacrylate disclosed in U.S. Pat. No. 4,123,276; and a composition comprising an esterified material of naphthoquinone azido sulfonic acid with pyrogallal-acetone resin and novolak resin described in U.S. Pat. No. 3,635,709.

The light-sensitive composition according to the present invention may contain a dye for image discrimination such as Crystal Violet, Methyl Violet, Malachite Green, Fuchsine, Parafuchsine, Victoria Blue BH (manufactured and sold by HODOGAYA CHEMICALS IND. INC.), Victoria Pure Blue BOH (HODOGAYA CHEMICALS IND. INC.), Oil Blue #603 (manufactured and sold by ORIENT CHEMICALS IND. INC.), Oil Pink #312 (ORIENT CHEMICALS IND. INC.), Oil Red 5B (ORIENT CHEMICALS IND. INC.), Oil Green #502 (ORIENT CHEMICALS IND. INC.), in an amount of from 0.3 to 15% by weight based on the total weight of the light-sensitive composition. It may also contain a compound capable of generating photodecomposition products which intereact with the dye mentioned above to cause change in color tone thereof, such as o-naphthoquinone diazido-4-sulfonic acid halogenide described in U.S. Pat. No. 3,969,118 trihalomethyl-2-pyrrone and trihalomethyl triazine disclosed in Japanese Patent Appln. (OPI) No. 53-36223, o-naphthoquinone diazide compounds disclosed in British Patent No. 2,038,801 2-trihalomethyl-5-aryl-1,3,4-oxadiazole compounds described in U.S. Pat. No. 4,279,982. These additives may be used alone or in combination, preferably in the amount of from 0.3 to 15% by weight. A filler may also be added to the light-sensitive composition. The addition of fillers makes it possible to further enhance physical properties of a resultant coated film and mat the surface of a light-sensitive layer as well as to improve the adherence under vacuum during exposing images and as a result, the formation of blur during exposure can effectively be prevented. Examples of such fillers include, for instance, talc powder, glass powder, clay, starch, wheat powder, maize meal, polytetrafluoroethylene powder. Furthermore, various kinds of other additives may be added to the light-sensitive composition of the present invention according to a variety of purposes.

According to the most important aspect of this invention, a specific fluorine-containing surfactant is incorporated into these aforementioned light-sensitive composition.

The fluorine-containing surfactant which can effectively be used is a copolymer of (i) an acrylate or a methacrylate having a fluoroaliphatic group (Rf) which has 3 to 20 carbon atoms and at least 40% by weight of fluorine atoms and at least three terminal carbon atoms of which are fully fluorinated and (ii) poly(oxyalkylene)-acrylate or poly(oxyalkylene)methacrylate, or a combination thereof, the Rf group containing acrylate or Rf group-containing methacrylate monomer unit being included in the copolymer in an amount of 25 to 70% by weight based on the weight of the copolymer.

The fluoroaliphatic group Rf is, in general, a saturated and monovalent aliphatic group. The group Rf may be a linear or branched chain or a cyclic or an alicyclic group such as an alkylcycloaliphatic group in the case where the group has a sufficiently large number of carbon atoms. The fluoroaliphatic backbone may have heteroatoms such as an oxygen and/or trivalent nitrogen atoms which are bonded dominantly to carbon atoms, which provide a stable bond between fluorinated carbon atoms and exert no influence on the inert property of the Rf group. In order to attain a sufficient intended effect, the Rf group should have 3 to 20 carbon atoms, preferably 6 to 12 carbon atoms and the content of fluorine atoms bonded to carbon atoms should be at least 40% by weight, preferably at least 50% by weight based on the total weight of the Rf group. As already mentioned, at least three terminal carbon atoms are fully fluorinated. The Rf group is, for instance, $CF_3CF_2CF_2-$ and preferred examples thereof are an alkyl group which is substantially completely, or fully fluorinated such as those represented by the formula:

$$C_nF_{2n+}$$ 

(n is an integer of at least 3).

The desired effect of the present invention cannot be attained if the fluorine atom content of the Rf group is less than 40% by weight. A more excellent effect is expected when fluorine atoms bonded to carbon atoms in the group Rf are localized at the vicinity of the terminal end thereof. Although it is possible to increase the fluorine content even if the Rf group has not more than two carbon atoms, the total fluorine content becomes insufficient and therefore, the desired effect cannot be expected. Moreover, a satisfactory result cannot be obtained even if the fluorine content is increased by increasing the ratio of sufficiently fluorinated monomer having at most two carbon atoms to the resultant copolymer. This is because the requirement of localization of fluorine atoms at the vicinity of the terminal end is not assured.

On the other hand, the desired sufficient effect cannot be expected when the number of carbon atoms contained in Rf group is more than 20. This results from the facts that the solubility of the resultant copolymer in a solvent is extremely reduced if the fluorine content is extremely high and that when the fluorine content is low, the localization of the fluorine atoms is not assured.

The soluble moiety of the copolymer is poly(oxyalkylene) group, $(OR')_x$ wherein $R'$ is an alkylene group having 2 to 4 carbon atoms and, for instance, $-CH_2CH_2-$, $-CH_2CH_2CH_2-$, $-CH(CH_3)CH_2-$ or $-CH(CH_3)CH(CH_3)-$ is preferred. The oxyalkylene units in the poly(oxyalkylene) group may be identical with each other as in poly(oxypropylene) or may be at least two different oxyalkylene groups randomly arranged in the poly(oxyalkylene) chain. Moreover, the units may be linear or branched oxypropylene and oxyethylene units or may be distributed in the poly(oxyalkylene) chain as linear or branched oxypropylene blocks and oxyethylene blocks. This poly(oxyalkylene) chain can be interrupted by or include at least one chain such as

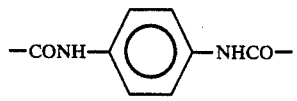

and $-S-$ in its backbone. When such chain is at least trivalent, the chain provides a branched oxyalkylene units in the poly(oxalkylene). In order to assure the desired solubility of the copolymer upon adding it to the light-sensitive composition, the molecular weight of the poly(oxyalkylene) group should fall within the range of from 250 to 2,500.

The copolymer used in the composition of this invention can be produced by the free-radical-initiated polymerization of, for instance, fluoroaliphatic group-containing acrylate or fluoroaliphatic group-containing methacrylate and poly(oxyalkylene)acrylate or poly(oxyalkylene)methacrylate such as monoacrylate or diacrylate or a mixture thereof. The molecular weight of the copolymer can be controlled by adjusting the concentration of the initiator used and activity thereof, the amount of monomers and the temperature of the polymerization reaction and further by the addition of a chain transfer agent such as thiols, for instance, n-octylmercaptan. For example, a copolymer having the following repeating units can be obtained by copolymerizing a fluoroaliphatic group-containing acrylate, $Rf-R''-O_2C-CH=CH_2$ (wherein $R''$ is, for instance, a sulfonamide alkylene, a carbonamide alkylene or an alkylene group) such as $C_8F_{17}SO_2N(C_4H_9)CH_2CH_2O_2CCH=CH$ and a poly(oxyalkylene)monoacrylate, $CH_2=CHC(O)(OR')_xOCH_3$:

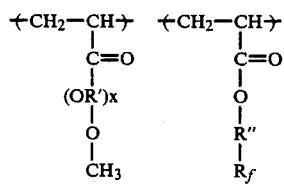

The aforementioned fluroaliphatic group containing acrylate is disclosed in U.S. Pat. Nos. 2,803,615; 2,642,416; 2,826,564; 3,102,103; 3,282,905 and 3,305,278.

The poly(oxyalkylene(acrylate and other acrylates which can be used to form the copolymer may be prepared by reacting a commercially available hydroxy poly(oxyalkylene) materials such as Pluronic (manufactured and sold by ASAHI DENKA INC. INC.), ADEKA Polyether (ASAHI DENKA IND. INC.), Carbowax (manufactured and sold by GLYCO PRODUCTS CO.), Triton (manufactured and sold by ROHM & HAAS CO.) and P.E.G. (available from DAIICHI KOGYO PHARMACEUTICALS CO.) with acrylic acid, methacrylic acid, acrylchloride or acrylic acid anhydride according to a known manner.

Alternatively, a poly(oxyalkylene)diacrylate, $CH_2=CHCO_2(R'O)_xCOCH=CH_2$, such as $CH_2=CHCO_2(C_2H_4O)_{10}(C_3H_6O)_{22}(C_2H_4O)_{10}COCH=CH_2$, prepared according to a known method, can be copolymerized with said fluoroaliphatic group-containing acrylate to obtain a copolymer having the following repeating units:

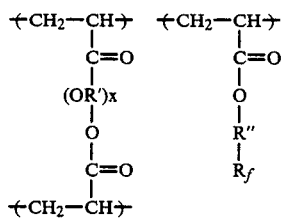

Other ethylenic unsaturated monomers having a fluoroaliphatic group at the terminal end which is suitable to form the copolymer used in the composition of the present invention are those disclosed in U.S. Pat. Nos. 2,592,069; 2,995,542; 3,078,245; 3,081,274; 3,291,843 and 3,325,163, while U.S. Pat. No. 3,574,791 discloses ethylenic unsaturated monomers useful for obtaining the aforementioned ethylenic unsaturated monomers having a fluoroaliphatic group at its terminal end.

The copolymer as used in the light-sensitive composition of this invention is the copolymer of a fluoroaliphatic group-containing acrylate or a fluoroaliphatic group-containing methacrylate with a poly(oxyalkylene) acrylate or a poly(oxyalkylene)methacrylate and the copolymer has the content of the fluoroaliphatic group-containing monomer of from 25 to 70% by weight based on the weight of the copolymer. The desired effect (i.e., evenness of thickness of the resultant light-sensitive layer) cannot be expected if the amount of the fluoroaliphatic group-containing monomer used is less than 25% by weight. On the contrary, the solubility of the copolymer in a solvent is extremely lowered if the amount of the monomer used is more than the upper limit i.e., 70% by weight. The molecular weight of the copolymer as used herein is preferably in the range of from 2,500 to 100,000. That is, a satisfactory effect is not attained if the molecular weight of the copolymer is less than 2,500 while if it exceeds 100,000, the solubility thereof in a solvent is remarkably reduced.

Preferred copolymers used in the present invention are those obtained by utilizing the fluoroaliphatic group-containing acrylate as one component of the fluoroaliphatic group-containing monomers in an amount of from 50 to 100% by weight with respect to the total amount of the latter and utilizing the poly(oxyalkylene)acrylate monomer unit in an amount of at least 15% by weight based on the total weight of the copolymer and in particular the copolymer obtained from a fluoroaliphatic group-containing acrylate and a poly(oxyalkylene)acrylate is preferred in the present invention. If the content of the fluoroaliphatic group-containing methacrylate in the fluoroaliphatic group-containing monomers is at least 50% by weight, the solubility of the copolymer is largely lowered. Moreover, when the amount of the poly(oxyalkylene)acrylate monomer is less than 15% by weight based on the total weight of the copolymer, the resultant coated film (light-sensitive layer) tends to have pin holes.

The preferred amount of the fluorine-containing surfactant falls within the range of from 0.01 to 5% by weight, more preferably from 0.05 to 3% by weight based on the weight of the light-sensitive composition (the total weight of coating components except for solvent). An insufficient effect is attained if the amount of the fluorine-containing surfactant used is less than 0.01% by weight. On the contrary, if the amount thereof is more than 5% by weight, a sufficient drying of the coated film is not accomplished and the performances e.g., development property is largely impaired.

The light-sensitive compositions containing these fluorine-containing surfactant is dissolved or dispersed in an organic solvent listed below or a mixture thereof, then applied to the surface of a support and dried to form a light-sensitive layer.

Organic solvents which can be used in the present invention to dissolve or disperse the light-sensitive composition and form a coating composition are selected from those having a boiling point of from 40 to 200° C., in particular 60 to 160° C., because they can easily be evaporated during drying operation.

Examples thereof suitably used in such operation include alcohols such as methyl alcohol, ethyl alcohol, n- or iso-propyl alcohol, n- or iso-butyl alcohol and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone and acetyl acetone; hydrocarbons such as benzene, toluene, xylene, cyclohexane, methoxybenzene; acetates such as ethyl acetate, n- or isopropyl acetate, n-or iso-butyl acetate, ethyl butyl acetate, hexyl acetate; halides such as methylene dichloride, ethylene dichloride, monochlorobenzene; ethers such a isopropyl ether, n-butyl, ether, dioxane, dimethyl dioxane, tetrahydrofuran; polyols and derivatives thereof such as, ethylene glycol, methyl cellosolve, methyl cellosolve acetate, ethyl cellosolve, diethyl cellosolve, cellosolve acetate, butyl cellosolve, butyl cellosolve acetate, methoxymethoxy ethanol, diethylene glycol monomethyl ether, diethylene glycol dimethyl ether, diethylene glycol methylethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, 3-methyl-3-methoxy butanol; other solvents such as dimethyl sulfoxide, N,N-dimethyl formamide. These solvents may be used separately or as a combination of at least two of them. The amount of solid content in the coating solution (composition) is suitably in the range of from 2 to 50% by weight.

The coating composition can be applied to a support by conventional methods such as roll coating, dip coating, air knife coating, gravure coating, gravure offset coating, hopper coating, blade coating, wire doctor coating, spray coating. The coated amount thereof is preferably in the range of from 10 to 100 ml/m².

The coating composition applied to the surface of the support is then dried to form a uniform light-sensitive layer. This process is in general carried out with hot air. The temperature of the drying air is usually 30 to 200° C., preferably 40 to 140° C. The drying operation may be effected under a condition of a constant temperature.

Alternatively, the drying temperature may gradually be changed so as to stepwise increase.

In some cases, a good result is obtained using dehumidified air for drying. The drying air is preferably supplied in a rate of 0.1 m/sec to 30 m/sec, preferably 0.5 to 20 m/sec to the coated surface.

Thus, according to the light-sensitive composition of this invention, the resultant light-sensitive layer has a very uniform thickness after drying, compared with conventional light-sensitive layers prepared from conventional compositions. This is true under an extremely wide range of drying conditions. Therefore, the quality of the printing plate as the final product can effectively be uniformalized and the installation for drying can be simplified.

Moreover, the light-sensitive composition according to the present invention is particularly effective in preparing a presensitized plate from which a lithographic printing plate is to be prepared, by continuously conveying a web support, successively coating the light-sensitive composition dissolved or dispersed in a suitable organic solvent or a mixture thereof (the coating composition) on the support and drying.

The light-sensitive composition according to the present invention will hereunder be explained in more detail with reference to working examples and the effects practically attained will also be discussed in comparison with comparative examples. In the following examples, "%" means "% by weight" unless otherwise specified.

EXAMPLES 1 TO 10, AND COMPARATIVE EXAMPLES (A) TO (E)

An aluminum web (0.3 mm in thickness and 1,000 mm in width) was continuously conveyed through 10% aqueous solution of tribasic sodium phosphate maintained at 80° C. for one minute to degrease the same. Then, the surface of the aluminum plate was grained with a nylon brush and an aqueous suspension of 400 mesh pumice and washed with water sufficiently. The aluminum plate thus treated was immersed in 25% sodium hydroxide aqueous solution maintained at 45° C. for 9 seconds to carry out the etching of the surface thereof, washed with water, then further immersed in 20% nitric acid for 20 seconds and washed with water. At this stage, the etched amount of the grained surface was about 8 g/m$^2$. Thereafter, the aluminum plate was anodized in 7% sulfuric acid as the electrolyte under a current density of 15 A/dm$^2$ to form 3 g/m$^2$ of direct current anodized film on the surface thereof and the plate was subjected to coating operation after washing and drying.

In the coating operation, a coating liquid having the following composition was used:

| | |
|---|---|
| Ester compound of naphthoquinone-1,2-diazido-5-sulfonyl chloride and pyrogallol-acetate resin (*1) | 0.90 g |
| Cresol-formaldehyde resin | 2.00 g |
| tert-Butylphenol-formaldehyde resin (*2) | 0.05 g |
| Naphthoquinone-1,2-diazido-4-sulfonyl chloride | 0.03 g |
| Oil Blue #603 (ORIENT CHEMICALS IND. INC.) | 0.05 g |
| Fluorine containing surfactant (see Table I) | 0.01 g |
| Methyl ethyl ketone | 10 g |
| Propylene glycol monomethyl ether | 8 g |
| Propylene glycol monomethyl ether acetate | 15 g |

(*1) The compound is disclosed in U.S. Pat. No. 3,635,709 (Example 1);
(*2) This resin is disclosed in U.S. Pat. No. 4,123,279.

The aforementioned coating liquid was continuously coated on the surface of this aluminum plate in an amount of 30 g/m$^2$, then dried by passing it through a drying zone to which hot air of 100° C. was supplied to form a light-sensitive layer.

The resulting light-sensitive layer was examined on the uniformity in thickness and the presence of pin holes. The results thus obtained are listed in the following Table I.

TABLE 1

| Surfactant | Example 1 | 2 | 3 | 4 | 5 | 6 | 7 | 8 | 9 |
|---|---|---|---|---|---|---|---|---|---|
| Rate of Monomer (by weight) | | | | | | | | | |
| N—Butylperfluorooctane sulfonamide ethyl acrylate $C_8F_{17}SO_2$—$N(C_4H_9)CH_2CH_2OCOCH=CH_2$ | 60 | 60 | 60 | 60 | 40 | 60 | 60 | 30 | 60 |
| Poly(oxyalkylene)acrylate $CH_3O$—$(C_2H_4O)_7$—$COCH=CH_2$ | 40 | | 20 | 20 | 60 | 40 | 40 | | 10 |
| Poly(oxyalkylene)methacrylate $CH_3O$—$(C_2H_4O)_7$—$COC(CH_3)=CH_2$ | | | | 20 | | | | | 30 |
| Poly(oxyalkylene)acrylate $CH_3O$—$(C_3H_7O)_7$—$COCH=CH_2$ | | 40 | 20 | | | | | 70 | |
| Molecular Weight | 15,000 | 15,000 | 15,000 | 15,000 | 15,000 | 5,000 | 50,000 | 50,000 | 15,000 |
| Uniformity of the light sensitive layer | A | A | A | A | B | B | A | A | A |
| Pin holes/ per 1000 m | 0 | 0 | 0 | 0 | 0 | 0 | 0 | 0 | 10 |

| Surfactant | 10 | Comparative Example a | b | c | d | Comparative Example e |
|---|---|---|---|---|---|---|
| Rate of Monomer (by weight) | | | | | | |
| N—Butylperfluorooctane sulfonamide ethyl acrylate $C_8F_{17}SO_2$—$N(C_4H_9)CH_2CH_2OCOCH=CH_2$ | 60 | 20 | 80 | 60 | 60 | Not Added |
| Poly(oxyalkylene)acrylate $CH_3O$—$(C_2H_4O)_7$—$COCH=CH_2$ | | 80 | 20 | | 40 | |
| Poly(oxyalkylene)methacrylate $CH_3O$—$(C_2H_4O)_7$—$COC(CH_3)=CH_2$ | 40 | | | | | |
| Poly(oxyalkylene)acrylate $CH_3O$—$(C_3H_7O)_7$—$COCH=CH_2$ | | | | 40 | | |
| Molecular Weight | 15,000 | 15,000 | 15,000 | 2,000 | 120,000 | |

TABLE 1-continued

| | | | | | | |
|---|---|---|---|---|---|---|
| Uniformity of the light sensitive layer | A | D the same as in Comparative Example (e) | D strong striped unevenness | D the same as in Comparative Example (e) | D strong striped unevenness | D |
| Pin holes/ per 1000 m | 65 | 0 | 50 | 0 | 25 | 0 |

A . . . uniform and no unevenness
B . . . slightly uneven
C . . . unevenness because of drying air or the like
D . . . severe unevenness because of drying air or the like As seen from the results listed in Table I, it is found that the uniformity in thickness of the layers obtained from the light-sensitive composition according to the present invention (Examples 1 to 10) is remarkably improved when compared with the results observed on the layer of Comparative Example (e) in which the fluorine-containing surfactant is not used. It is also found that the layers (Examples 1 to 8) have no pin hole and a substantially excellent appearance. While there is observed that the layers in Comparative Examples a to d, in which the fluorine-containing surfactant used does not satisfy the conditions defined in this invention, do not have an acceptable uniformity in thickness.

The light-sensitive plates obtained in Examples 1 to 10 was exposed to light through a positive transparency which was closely brought into contact therewith and then was developed with a developer for positive working composition to form lithographic printing plates. As a result, it is found that these plates produced have a high sensitivity and can produce the original patterns with good uniformity and reproduction. When these plates were subjected to printing operation, they were excellent in printing durability and resin image strength.

EXAMPLES 11 TO 18 AND COMPARATIVE EXAMPLE (F)

The anodized aluminum web plate in Example 1 was treated by passing it through 2.5% aqueous solution of sodium silicate at 70° C. for 30 seconds, washing and drying. The aluminum plate thus treated was coated with a light-sensitive composition having the following composition:

| | |
|---|---|
| 2-Hydroxyethyl methacrylate copolymer (*3) | 1.75 g |
| 2-Methoxy-4-hydroxy-5-benzoyl benzene sulfonic acid salt of a condensate of p-diazo-diphenyl amine and formaldehyde | 0.2 g |
| Oil Blue #603 (ORIENT CHEMICALS IND. INC.) | 0.05 g |
| Fluorine containing surfactant (*4) | 0.01 g |
| Methyl glycol | 24 g |
| Methanol | 24 g |

(*3) The copolymer is disclosed in U.S. Pat. No. 4,123,276 (Example 1).
(*4) The fluorine containing surfactants used in Examples 1 to 8 were used in the compositions of Examples 11 to 18 respectively, while it was not added to the composition of Comparative Example (f).

Each coating composition was continuously coated on the surface of the aluminum plate in an amount of 40g/m$^2$ and dried by passing it through the first drying zone, to which hot air of 80° C. was introduced, for one minute, then the second drying zone, to which hot air of 100° C. was supplied, for one minute to form a light-sensitive layer.

Consequently, it was observed a strong but unclear unevenness in thickness on the surface of the light-sensitive layer in which the fluorine-containing surfactant was not added (Comparative Example (f)). On the contrary, the lightsensitive layers obtained in Examples 11 to 18 had uniform thickness and no pin hole.

The strip-like product thus prepared was cut into sheets which were used as a negative working light-sensitive plate. These light-sensitive plates were found to be excellent in sensitivity and image reproduction and the lithographic printing plates obtained from the light-sensitive plates were excellent in printing durability and resin image strength.

EXAMPLES 19 TO 21

Light-sensitive plates were produced according to procedures similar to those described in Example 1.

Likewise, lithographic printing plates were prepared from the presensitized plates except that the following fluorine-containing surfactants were used and the same results as in Example 1 were obtained on the resulting light-sensitive layers. Good results were obtained in Example 1.

| | |
|---|---|
| Example 19: | |
| C$_6$F$_{13}$SO$_2$N(C$_4$H$_9$)CH$_2$CH$_2$OCOCH=CH$_2$ | 60% |
| CH$_3$O(C$_2$H$_4$)$_7$COCH=CH$_2$ | 40% |
| Molecular weight: 20,000 | |
| Example 20: | |
| C$_8$F$_{17}$SO$_2$N(C$_2$H$_5$)CH$_2$CH$_2$OCOCH=CH$_2$ | 50% |
| HO(C$_2$H$_4$O)$_{10}$(C$_3$H$_6$O)$_{22}$(C$_2$H$_4$O)$_{10}$COCH=CH$_2$ | 50% |
| Molecular weight: 30,000 | |
| Example 21: | |
| C$_8$F$_{17}$CH$_2$CH$_2$OCOCH=CH$_2$ | 40% |
| CH$_3$O(C$_2$H$_4$O)$_{16}$COCH=CH$_2$ | 60% |
| Molecular weight: 30,000 | |

What is claimed is:

1. A light-sensitive composition comprising, in admixture, a fluorine-containing surfactant and a light-sensitive ingredient, wherein:
   (a) the fluorine-containing surfactant is a copolymer of (i) an acrylate having a fluoroaliphatic group, Rf, which has 3 to 20 carbon atoms and at least 40% by weight of fluorine atoms, and at least three terminal carbon atoms which are fully fluorinated; and (ii) a poly(oxyalkylene) acrylate, or a combination of a poly(oxyalkylene)acrylate with a poly(oxyalkylene)methacylate;
   (b) the Rf group-containing acrylate monomer unit is included in the copolymer in an amount of from 25 to 70% by weight based on the total weight of the copolymer;
   (c) the copolymer has a molecular weight of from 2,500 to 100,000;
   (d) the poly(oxyalkylene)acrylate monomer unit is included in an amount of at least 15% by weight based on the total weight of the copolymer;
   (e) the fluorine-containing surfactant is included in an amount of from 0.01 to 5% by weight based on the total weight of the light-sensitive composition;

(f) the light-sensitive ingredient, after exposure to light, has a change in solubility or swelling property in a developer;

(g) the light-sensitive ingredient is selected from the group of a diazo resin, an o-quinone diazide and an ethylenic unsaturated compound having at least two unsaturated double bonds in the molecule, capable of causing polymerization reaction upon exposure to actinic radiation; and (h) the light-sensitive ingredient is included in an amount sufficient to make said composition light-sensitive.

2. The light-sensitive composition as set forth in claim 1, wherein the amount of the fluorine-containing surfactant is in the range of from 0.05 to 5% by weight based on the total weight of the light-sensitive composition.

3. The light-sensitive composition as set forth in claim 2, wherein the amount of the fluorine-containing surfactant is in the range of from 0.05 to 3% by weight.

4. The light-sensitive composition as set forth in claim 1, wherein the poly(oxyalkylene) group in the copolymer has a molecular weight of 250 to 2,500.

5. The light-sensitive composition as set forth in claim 1, wherein the fluoroaliphatic group has 6 to 12 carbon atoms and the fluorine atom content thereof is at least 50% by weight.

6. The light-sensitive composition as set forth in claim 5, wherein the amount of the fluorine-containing surfactant is in the range of from 0.05 to 3% by weight.

7. The light-sensitive composition as set forth in claim 5, wherein the copolymer comprises fluoroaliphatic group-containing acrylate monomer units and poly(oxyalkylene)acrylate monomer units.

8. The light-sensitive composition as set forth in claim 7, wherein the poly(oxyalkylene) group in the copolymer has a molecular weight of 250 to 2,500.

9. The light-sensitive composition as set forth in claim 1, wherein component (ii) is a poly(oxyalkylene)acrylate.

10. The light-sensitive coating composition comprising a fluorine-containing surfactant and a light-sensitive ingredient which are dissolved or dispersed in an organic solvent or a mixture thereof having a boiling point of from 40° to 200° C., wherein:

(a) the fluorine-containing surfactant is a copolymer of (i) an acrylate having a fluoraliphatic group, Rf, which has 3 to 20 carbon atoms and at least 40% by weight of fluorine atoms,a nd at least three terminal carbon atoms which are fully fluorinated; and (ii) a poly(oxyalkylene)acrylate, or a combination of a poly(oxyalkylene)acrylate with a poly(oxyalkylene)methacrylate;

(b) the Rf group-containing acrylate monomer unit is included in the copolymer in an amount of from 25 to 70% by weight based on the total weight of the copolymer;

(c) the copolymer has a molecular weight of from 2,500 to 100,000;

(d) the poly(oxyalkylene)acrylate monomer unit is included in an amount of at least 15% by weight based on the total weight of the copolymer;

(e) the fluorine-containing surfactant is included in an amount of from 0.01 to 5% by weight based on the total weight of the light-sensitive composition;

(f) the light-sensitive ingredient, after exposure to light, has a change in solubility or swelling property in a developer;

(g) the light-sensitive ingredient is selected from the group of a diazo resin, an o-quinone diazide and an ethylenic unsaturated compound having at least two unsaturated double bonds in the molecule, capable of causing polymerization reaction upon exposure to actinic radiation; and (h) the light-sensitive ingredient is included in an amount sufficient to make said composition light-sensitive.

11. The light-sensitive coating composition as set forth in claim 10 wherein the solid content of the coating composition is in the range of from 2 to 50% by weight.

12. A presensitized plate from which a lithographic printing plate is to be prepared, which plate comprises a support having provided thereon a light-sensitive layer including a light-sensitive composition comprising, in admixture, a fluorine-containing surfactant and a light-sensitive ingredient, wherein:

(a) the fluorine-containing surfactant is a copolymer of (i) an acrylate having a fluoraliphatic group, Rf, which has 3 to 20 carbon atoms and at least 40% by weight of fluorine atoms, and at least three terminal carbon atoms which are fully fluorinated; and (ii) a poly(oxyalkylene)acrylate, or a combination of a poly(oxyalkylene)acrylate with a poly(oxyalkylene)methacrylate;

(b) the Rf group-containing acrylate monomer unit is included in the copolymer in an amount of from 25 to 70% by weight based on the total weight of the copolymer;

(c) the copolymer has a molecular weight of from 2,500 to 100,000;

(d) the poly(oxyalkylene)acrylate monomer unit is included in an amount of at least 15% by weight based on the total weight of the copolymer;

(e) the fluorine-containing surfactant is included in an amount of from 0.01 to 5% by weight based on the total weight of the light-sensitive composition;

(f) the light-sensitive ingredient, after exposure to light, has a change in solubility or swelling property in a developer;

(g) the light-sensitive ingredient is selected from the group of a diazo resin, an o-quinone diazide and an ethylenic unsaturated compound having at least two unsaturated double bonds in the molecule, capable of causing polymerization reaction upon exposure to actinic radiation; and (h) the light-sensitive ingredient is included in an amount sufficient to make said composition light-sensitive.

* * * * *